(12) United States Patent
Ji et al.

(10) Patent No.: US 9,210,429 B2
(45) Date of Patent: Dec. 8, 2015

(54) ENCODER OF E-8VSB FORWARD ERROR CORRECTION FOR DIGITAL TELEVISION SYSTEM OF ATSC

(71) Applicant: ELECTRONICS AND TELECOMMUNICATIONS RESEARCH INSTITUTE, Daejon (KR)

(72) Inventors: Kum-ran Ji, Jeollanam-do (KR); Sung-hoon Kim, Daejeon (KR); Jae-young Lee, Seoul (KR); Seung-won Kim, Daejeon (KR); Soo-in Lee, Daejeon (KR); Chie-teuk Ahn, Daejeon (KR); Jae-bum Kim, Daejeon (KR); Hyun-cheol Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 96 days.

(21) Appl. No.: 13/667,633

(22) Filed: Nov. 2, 2012

(65) Prior Publication Data

US 2013/0077698 A1 Mar. 28, 2013

Related U.S. Application Data

(62) Division of application No. 11/816,357, filed as application No. PCT/KR2006/000538 on Feb. 16, 2006, now Pat. No. 8,325,823.

(30) Foreign Application Priority Data

Feb. 16, 2005 (KR) .................. 10-2005-0012814

(51) Int. Cl.

| | |
|---|---|
| *H04N 7/12* | (2006.01) |
| *H04N 19/89* | (2014.01) |
| *H04N 19/61* | (2014.01) |
| *H04N 7/68* | (2006.01) |
| *H04N 19/00* | (2014.01) |
| *H04N 19/40* | (2014.01) |
| *G06K 9/38* | (2006.01) |
| *H03M 13/29* | (2006.01) |
| *H04L 1/00* | (2006.01) |
| *H04L 27/02* | (2006.01) |
| *H04N 19/102* | (2014.01) |

(52) U.S. Cl.
CPC ............ *H04N 19/00933* (2013.01); *G06K 9/38* (2013.01); *H03M 13/2906* (2013.01); *H03M 13/2936* (2013.01); *H03M 13/2939* (2013.01); *H04L 1/006* (2013.01); *H04L 1/0041* (2013.01); *H04L 1/0065* (2013.01); *H04L 27/02* (2013.01); *H04N 7/26335* (2013.01); *H04N 7/26941* (2013.01); *H04N 7/50* (2013.01); *H04N 7/68* (2013.01); *H04N 19/89* (2014.11); *H04N 7/26111* (2013.01)

(58) Field of Classification Search
CPC ....... H04N 7/50; H04N 7/68; H04N 7/26335; H04N 7/26941; H04N 7/26111; G06K 9/38
USPC ........... 375/240.27, 240.25, 240.26; 382/233, 382/235, 237
See application file for complete search history.

(56) References Cited

U.S. PATENT DOCUMENTS

| | | | | |
|---|---|---|---|---|
| 5,553,101 A | * | 9/1996 | Lim et al. ...................... | 375/340 |
| 6,100,826 A | * | 8/2000 | Jeon et al. ...................... | 341/67 |

(Continued)

*Primary Examiner* — Shawn An
(74) *Attorney, Agent, or Firm* — Kile Park Reed & Houtteman PLLC

(57) ABSTRACT

Provided is an error correcting encoder and, more particularly, to an error correcting encoder used for an improved transmission method of the Advanced Television System Committee (ATSC), and a method thereof. The error correcting encoder for digital television broadcasting, which is suggested in the present research, includes a robust encoder for encoding a one-bit input into robust encoded data; a pre-coding block for receiving the robust encoded data and performing pre-coding to thereby produce a pre-coded signal; and a trellis encoding block for performing trellis encoding on the robust encoded data and the pre-coded signal.

2 Claims, 3 Drawing Sheets

(56) References Cited

U.S. PATENT DOCUMENTS

| | | | |
|---|---|---|---|
| 6,201,563 B1 * | 3/2001 | Rhee | 348/21 |
| 7,058,141 B1 * | 6/2006 | Nedic | 375/341 |
| 7,586,982 B2 * | 9/2009 | Nguyen et al. | 375/233 |
| 2006/0088119 A1 * | 4/2006 | Fu et al. | 375/265 |
| 2007/0140368 A1 * | 6/2007 | Kim et al. | 375/265 |

* cited by examiner

ENCODER OF E-8VSB FORWARD ERROR CORRECTION FOR DIGITAL TELEVISION SYSTEM OF ATSC

CROSS REFERENCE TO RELATED APPLICATIONS

This application is a divisional application of U.S. patent application Ser. No. 11/816,357, filed on Aug. 15, 2007 (currently pending), the disclosure of which is herein incorporated by reference in its entirety. The U.S. patent application Ser. No. 11/816,357 is a national entry of International Application No. PCT/KR2006/000538, filed on Feb. 16, 2006, which claims priority to Korean Application No. 10-2005-0012814 filed on Feb. 16, 2005, the entire contents of which are incorporated herein by reference.

TECHNICAL FIELD

The present invention relates to an error correcting code encoder; and, more particularly, to an apparatus for encoding error correcting codes which are used in an advanced transmission method of a terrestrial digital television broadcasting system based on the Advanced Television System Committee (ATSC), and a method thereof.

BACKGROUND ART

Rapid development in digital technology also affects a broadcasting field, and it stimulates the combination between a broadcasting network and the Internet. However, the conventional terrestrial television (TV) broadcasting method of the Advanced Television System Committee (ATSC) has a problem that the broadcasting cannot be received in mobile and portable terminals and even if it is received, the reception performance is poor. Detailed description on the ATSC DTV standards and the A/53 is presented at http://www.atsc.org.

FIG. 1 is a block diagram showing a conventional digital television (DTV) transmitting block. As illustrated in the drawing, data inputted into the transmitting block 100 are serial data streams each of which includes 188-byte MPEG-compatible data packets including a synch byte and 187-byte payload data. The inputted data are randomized in a data randomizer 101, and each packet is encoded to include 20-byte parity information for Forward Error Correction (FEC), Reed Solomon (RS) coding, and 1/6 data field interleaving, and 2/3 trellis coding. According to the Advanced Television System Committee (ATSC), the data randomizer 101 performs XOR on all payload data bytes inputted to a pseudo random binary sequence (PRBS) having the maximum length of 16 bits, which is initialized at the starting point of a data field.

The RS encoder 103 receives the randomized data and generates data of a total of 207 bytes per data segment by adding 20 RS parity bytes for FEC to the 187-byte data.

Among the inputted packet data, the randomization and FEC are not performed onto sync data which correspond to a segment sync signal.

Subsequently, data packets included in sequential segments of each data field are interleaved in a data interleaver 105, and the interleaved data packets are interleaved again and encoded in a trellis encoder 107. The trellis encoder 107 generates a stream of a data symbol expressed in three bits by using additional two bits inputted thereto. One bit of the inputted two bits is pre-coded and the other bit goes through a 4-state trellis encoding to be reduced into two bits. The outputted three bits are mapped to an 8-level symbol. The trellis encoder 107 includes 12 parallel trellis encoders and some pre-coders to generate 12 interleaved and encoded data sequences.

An 8-level symbols is combined with a segment sync and field sync bit sequences 117 which are transmitted from a synchronization unit (not shown) to thereby generate data frames for transmission. Subsequently, a pilot signal is added in a pilot adder 111. A symbol stream goes through Vestigial Side Band (VSB) suppressed-carrier modulation in a VSB modulator 113. An 8-level symbol stream of a baseband is finally transformed into a radio frequency signal in a Radio Frequency (RF) signal converter 115.

Error correction codes of the ATSC digital terrestrial TV broadcasting use RS codes as external codes and use concatenated codes formed of 2/3 trellis codes as internal codes.

FIG. 2 is a block diagram describing a structure of the trellis encoder of FIG. 1. The FIG. 2 shows a structure of the trellis encoder used in an internal error correcting encoder of the ATSC digital terrestrial TV broadcasting and it shows 8-VSB modulation symbol allocation based on the output of the trellis encoder.

Referring to FIG. 2, the trellis encoder 107 includes a pre-coding block and a 2/3 trellis encoding block. Two bits $X_1$ and $X_2$ from the data interleaver 105 are inputted into the trellis encoding block whose encoding rate is 2/3 to thereby produce three output bits $z_0$, $z_1$ and $z_2$. The output bits $z_0$, $z_1$ and $z_2$ are allocated with 8 symbols and they go through 8-VSB modulation in the VSB modulator 113. The number of memories of the trellis encoder 107 is two and thus, the number of trellis states becomes 4 during decoding.

However, conventional 8-VSB transceivers provide distorted signals in indoor and mobile channel environments due to variable channel and multipath phenomenon and, for this reason, signal reception performance is poor in receivers. To solve the problem, researchers are studying to develop an advanced transmission scheme having a strong error correction function, and it is called for to develop an excellent error correcting encoder suitable for the advanced transmission scheme, and an encoding method thereof.

DISCLOSURE

Technical Problem

It is, therefore, an object of the present invention, which is devised to overcome the shortcoming of conventional technologies, to provide an error correcting encoder for digital television (TV) broadcasting and a method thereof.

It is another object of the present invention to an error correcting encoder which is improved from the conventional Advanced Television System Committee (ATSC) suitably for an error correction of a dual stream transmission method.

The other objects and advantages of the present invention will be understood by those skilled in the art of the present invention from the drawing, detailed description, and claims of the present invention.

Technical Solution

In accordance with one aspect of the present invention, there is provided an error correcting encoder for digital television broadcasting, which includes: a robust encoder for encoding a one-bit input into robust encoded data; a pre-coding block for receiving the robust encoded data and performing pre-coding to thereby produce a pre-coded signal; and a trellis encoding block for performing trellis encoding on the robust encoded data and the pre-coded signal.

In accordance with another aspect of the present invention, there is provided an error-correction encoding method for digital television broadcasting, which includes the steps of: a) encoding a one-bit input into robust encoded data by using shift registers and XOR operation units; b) receiving the robust encoded data and performing pre-coding to thereby produce a pre-coded signal; and c) performing trellis encoding on the robust encoded data and the pre-coded signal.

Advantageous Effects

The technology of the present invention can improve error correction performance by reducing the encoding rate from 2/3 to 1/3 and increasing the number of memories from two to four in an error correcting encoder. Although the final encoding rate is changed from 2/3 to 1/3, the error correcting encoder still remains compatible with a conventional system using 8-Vestigial Side Band (VSB) scheme by outputting 8 symbols. Therefore, the present invention can provide an internal error correcting encoder suitable for dual stream transmission.

DESCRIPTION OF DRAWINGS

The above and other objects and features of the present invention will become apparent from the following description of the preferred embodiments given in conjunction with the accompanying drawings, in which.

BEST MODE FOR THE INVENTION

Other objects and aspects of the invention will become apparent from the following description of the embodiments with reference to the accompanying drawings, which is set forth hereinafter. Also, when it is considered that detailed description on a related art may obscure the points of the present invention, the description will not be provided herein.

Hereinafter, preferred embodiments of the present invention will be described in detail with reference to the accompanying drawings.

Figure 3:
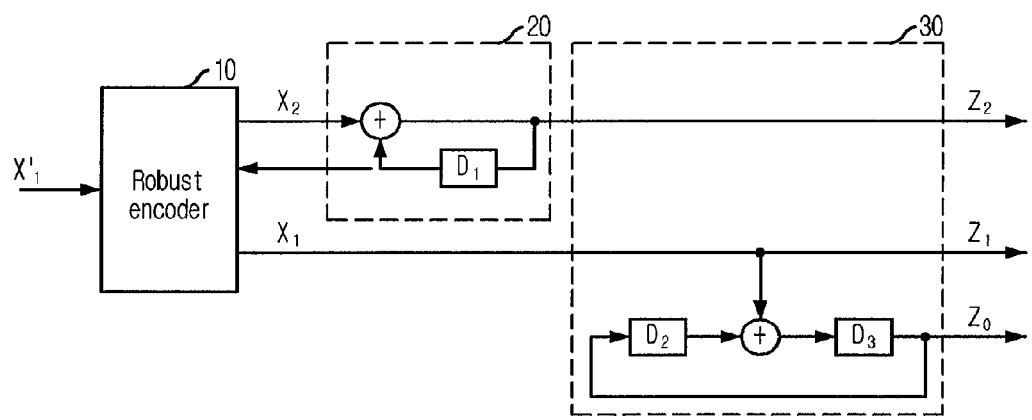
FIG. 3 is a block diagram illustrating a structure of an internal error correcting encoder in accordance with an embodiment of the present invention.

FIG. 3 is a block diagram illustrating a structure of an internal error correcting encoder in accordance with an embodiment of the present invention. The internal error correcting encoder of FIG. 3 can be applied to an improved transmission method of digital terrestrial television (TV) broadcasting.

Referring to FIG. 3, the internal error correcting encoder includes a robust encoder 10, a pre-coding block 20, and a trellis encoding block 30. The robust encoder 10 receives a one-bit input signal $X_1'$ from an interleaver (not shown) and outputs $X_1$ and $X_2$ which correspond to input data of a conventional internal error correcting encoder. The pre-coding block 20 receives the $X_2$ and outputs a $Z_2$ symbol. The trellis encoding block 30 receives $X_1$ and $X_2$ and outputs $Z_0$ and $Z_1$ symbols at an encoding rate of 2/3. The internal error correcting encoder of the present invention further includes the robust encoder 10 in addition to the conventional encoder. A trellis encoder which is formed of the pre-coding block 20 and the trellis encoding block 30 follows structure defined in the Advanced Television System Committee (A/53) Standards. Thus, each of the pre-coding block and the trellis encoding block includes a register (D) for storing a bit delay value, for example, 12-bit delay value. The internal error correcting encoder finally outputs $Z_0$, $Z_1$ and $Z_2$ and the encoding rate becomes 1/3. Although the final encoding rate is 1/3, the internal error correcting encoder can maintain the compatibility with devices of conventional transmission schemes by outputting 8 symbols.

Figure 4:
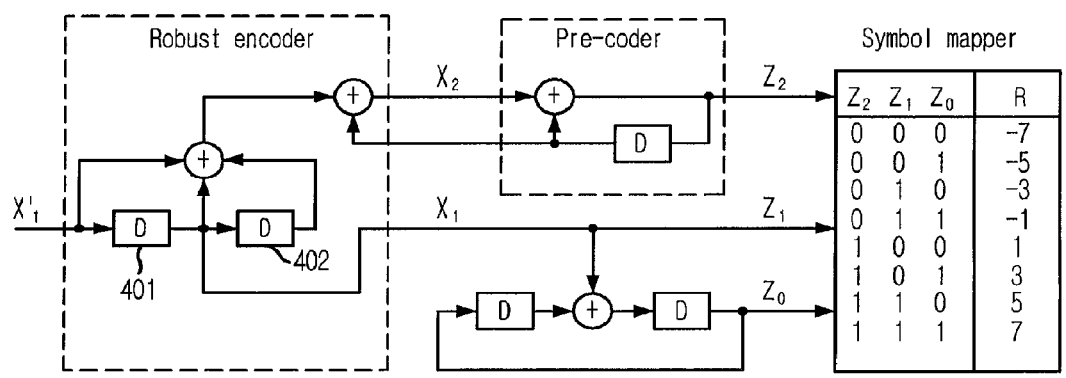
FIG. 4 is a block diagram describing the internal error correcting encoder in detail in accordance with an embodiment of the present invention.

FIG. 4 is a block diagram describing the internal error correcting encoder in detail in accordance with an embodiment of the present invention.

Referring to FIG. 4, bits $X_1(k)$ and $X_2(k)$ corresponding to the input of a conventional encoder which receives an input bit $X_1'(k)$ at time k are outputted as shown in the following equations.

$$X_1(k) = X_1'(k-1)$$
$$X_2(k) = Z_2(k-1) \oplus \{X_1'(k) \oplus X_1'(k-1) \oplus X_1'(k-2)\} \quad \text{Eq. 1}$$

where $\oplus$ denotes an exclusive-or (XOR) operation; and $X(k-d)$ denotes a bit signal of X delayed by d at time k.

Referring to FIG. 4 and the Equation 1, the error correcting encoder of the present invention encodes input signals by using a total of four memories, i.e., two memories in a standard trellis encoder and two memories 401 and 402 in the robust encoder 10.

Output signals based on the input of the internal error correcting encoder presented according to the Equation 1 and the state thereof are as shown in Tables 1 and 2.

TABLE 1

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| 0 | −7 | −5 | −7 | −5 | 1 | 3 | 1 | 3 | −3 | −1 | −3 | −1 | 5 | 7 | 5 | 7 |
| 1 | 1 | 3 | 1 | 3 | −7 | −5 | −7 | −5 | 5 | 7 | 5 | 7 | −3 | −1 | −3 | −1 |

TABLE 2

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| 0 | 0 | 2 | 1 | 3 | 0 | 2 | 1 | 3 | 5 | 7 | 4 | 6 | 5 | 7 | 4 | 6 |
| 1 | 12 | 14 | 13 | 15 | 12 | 14 | 13 | 15 | 9 | 11 | 8 | 10 | 9 | 11 | 8 | 10 |

Since the robust encoder 10 has two memories, the total number of memories of the internal error correcting encoder becomes four. Thus, the number of trellis states becomes 16 after decoding.

In the specification of the present invention, the robust encoded data are the output signals $X_1$ and $X_2$ of the robust encoder 10.

When internal error-correction encoding is carried out as described in the embodiment, a receiving part can improve the performance of its receiver by performing trellis decoding with reference to the Tables 1 and 2. To be specific, the receiving part converts a receiving signal into a baseband signal, performs equalization for determining the symbol level of the receiving signal, and decodes the determined symbol level into a data symbol such that the symbol level and the state corresponding thereto are as shown in the Tables 1 and 2. Detailed description on the receiving part is presented in Korean Patent Publication No. 2004-64306.

<Experimental Result>

Figure 1:
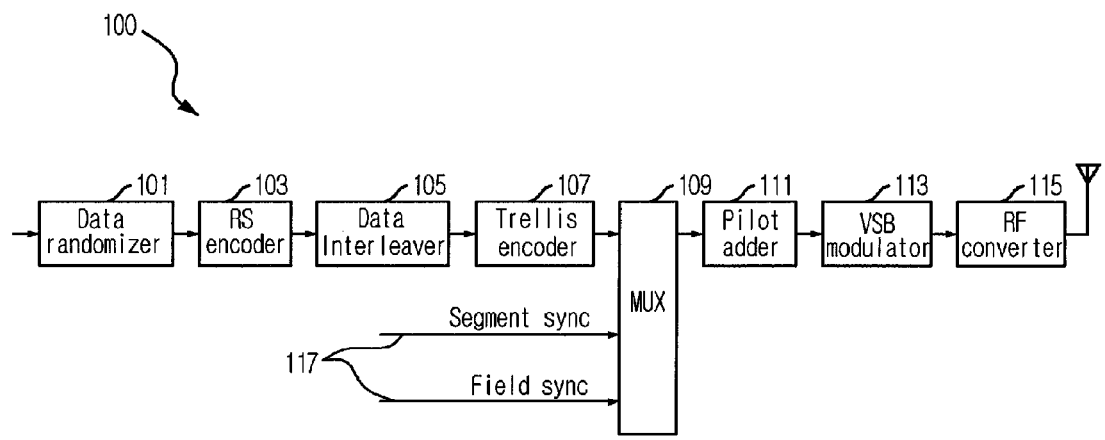
FIG. 1 is a block diagram showing a conventional DTV transmitting block.
Figure 2:
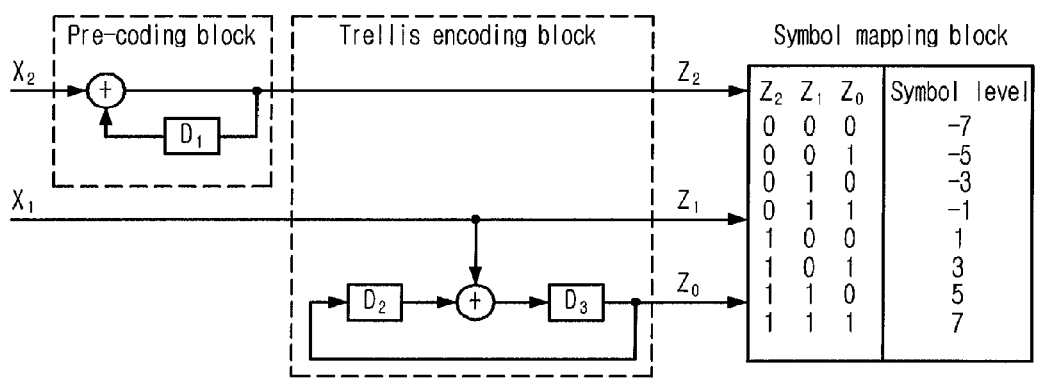
FIG. 2 shows a trellis encoder of FIG. 1.
Figure 5:
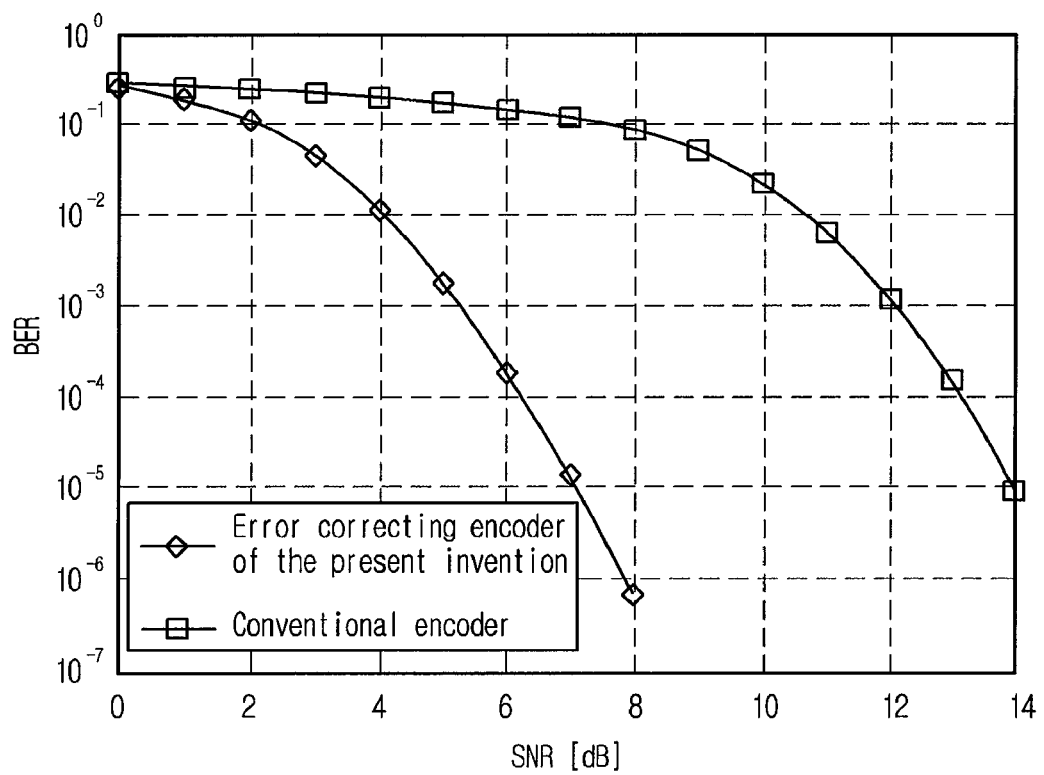
FIG. 5 is a graph presenting Bit Error Rate (BER) performance curves with respect to a Signal-to-Noise Ratio (SNR) in a conventional encoder and the error correcting encoder of the present invention.

Computer simulation results on the performance of the conventional encoder shown in FIG. 1 and the internal error correcting encoder of FIG. 4 will be described herein. FIG. 5 is a graph showing Bit Error Rate (BER) performance curves with respect to a Signal-to-Noise Ratio (SNR) in the conventional encoder and the error correcting encoder of the present invention. Herein, an Additive White Gaussian Noise (AWGN) model was used as a noise channel, an error rate was computed by using a Monte Carlo simulation method and dividing the entire errors by transmitted data.

The result was that the internal error correcting encoder of the present invention had power gain of about 7 dB compared to the conventional encoder, with respect to a bit error rate $10^{-5}$.

The method of the present invention is realized as a program and stored in a computer-readable recording medium, such as CD-ROM, RAM, ROM, floppy disks, hard disks, and magneto-optical disk and the like. Since this process can be easily implemented by those of ordinary skill in the art, detailed description on it will not be provided herein.

While the present invention has been described with respect to certain preferred embodiments, it will be apparent to those skilled in the art that various changes and modifications may be made without departing from the scope of the invention as defined in the following claims.

What is claimed is:

1. An error correcting decoder for digital television broadcasting, comprising:
    a receiver configured to convert a receiving signal into a baseband signal and to determine a symbol level of the receiving signal; and
    a decoder configured to perform trellis decoding on the symbol level, wherein the trellis decoding is 16-state trellis decoding on robust encoded data,
    wherein the 16-state trellis decoding decodes the symbol level into a data symbol such that a symbol level and a state corresponding thereto are as shown in Tables 1 and 2:

TABLE 1

|   | 0 | 1 | 2 | 3 | 4 | 5 | 6 | 7 |
|---|---|---|---|---|---|---|---|---|
| 0 | −7 | −5 | −7 | −5 | 1 | 3 | 1 | 3 |
| 1 | 1 | 3 | 1 | 3 | −7 | −5 | −7 | −5 |
|   | 8 | 9 | 10 | 11 | 12 | 13 | 14 | 15 |
| 0 | −3 | −1 | −3 | −1 | 5 | 7 | 5 | 7 |
| 1 | 5 | 7 | 5 | 7 | −3 | −1 | −3 | −1 |

TABLE 2

|   | 0 | 1 | 2 | 3 | 4 | 5 | 6 | 7 |
|---|---|---|---|---|---|---|---|---|
| 0 | 0 | 2 | 1 | 3 | 0 | 2 | 1 | 3 |
| 1 | 12 | 14 | 13 | 15 | 12 | 14 | 13 | 15 |
|   | 8 | 9 | 10 | 11 | 12 | 13 | 14 | 15 |
| 0 | 5 | 7 | 4 | 6 | 5 | 7 | 4 | 6 |
| 1 | 9 | 11 | 8 | 10 | 9 | 11 | 8 | 10. |

2. An error-correcting decoding method for digital television broadcasting, comprising the steps of:
    converting a receiving signal into a baseband signal;
    determining a symbol level of the receiving signal; and
    performing trellis decoding on a symbol level, wherein the trellis decoding is 16-state trellis decoding on robust encoded data,
    wherein the 16-state trellis decoding decodes the symbol level into a data symbol such that a symbol level and a state of the robust encoded data corresponding thereto are as shown in Tables 1 and 2:

TABLE 1

|   | 0 | 1 | 2 | 3 | 4 | 5 | 6 | 7 |
|---|---|---|---|---|---|---|---|---|
| 0 | −7 | −5 | −7 | −5 | 1 | 3 | 1 | 3 |
| 1 | 1 | 3 | 1 | 3 | −7 | −5 | −7 | −5 |
|   | 8 | 9 | 10 | 11 | 12 | 13 | 14 | 15 |
| 0 | −3 | −1 | −3 | −1 | 5 | 7 | 5 | 7 |
| 1 | 5 | 7 | 5 | 7 | −3 | −1 | −3 | −1 |

TABLE 2

|   | 0 | 1 | 2 | 3 | 4 | 5 | 6 | 7 |
|---|---|---|---|---|---|---|---|---|
| 0 | 0 | 2 | 1 | 3 | 0 | 2 | 1 | 3 |
| 1 | 12 | 14 | 13 | 15 | 12 | 14 | 13 | 15 |
|   | 8 | 9 | 10 | 11 | 12 | 13 | 14 | 15 |
| 0 | 5 | 7 | 4 | 6 | 5 | 7 | 4 | 6 |
| 1 | 9 | 11 | 8 | 10 | 9 | 11 | 8 | 10. |

* * * * *